(12) United States Patent
Goetz et al.

(10) Patent No.: US 7,522,461 B2
(45) Date of Patent: Apr. 21, 2009

(54) MEMORY DEVICE ARCHITECTURE AND METHOD FOR IMPROVED BITLINE PRE-CHARGE AND WORDLINE TIMING

(75) Inventors: Marco Goetz, Radebeul (DE); Nimrod Ben-Ari, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 193 days.

(21) Appl. No.: 11/593,444

(22) Filed: Nov. 6, 2006

(65) Prior Publication Data
US 2008/0106960 A1    May 8, 2008

(51) Int. Cl.
*G11C 7/00* (2006.01)
(52) U.S. Cl. ............... 365/203; 365/230.06; 365/210.1
(58) Field of Classification Search ........... 365/203, 365/230.06, 210
See application file for complete search history.

(56) References Cited

U.S. PATENT DOCUMENTS

| 5,029,135 | A | 7/1991 | Okubo |
| 5,999,482 | A | 12/1999 | Kornachuk et al. |
| 7,099,214 | B2 * | 8/2006 | Nakaya .................. 365/204 |
| 7,248,518 | B2 * | 7/2007 | Ku et al. ................ 365/203 |
| 2004/0257895 | A1 | 12/2004 | Lee |

* cited by examiner

*Primary Examiner*—Huan Hoang
(74) *Attorney, Agent, or Firm*—Slater & Matsil, L.L.P.

(57) ABSTRACT

A memory device architecture having improved bitline pre-charge and wordline timing operations includes a pre-charge driver, a pre-charge line, a timing controller, a wordline driver, and a wordline coupled to a selected memory cell. The pre-charge driver is operable to supply a pre-charge signal to a pre-charge line when activated by the pre-charge triggering signal. The pre-charge line is operable to supply a pre-charge output signal. The timing controller is coupled to receive the pre-charge output signal, and based thereon, provide a wordline triggering signal. The wordline triggering signal is supplied to the wordline driver, which applies a wordline signal to the selected memory cell.

31 Claims, 6 Drawing Sheets

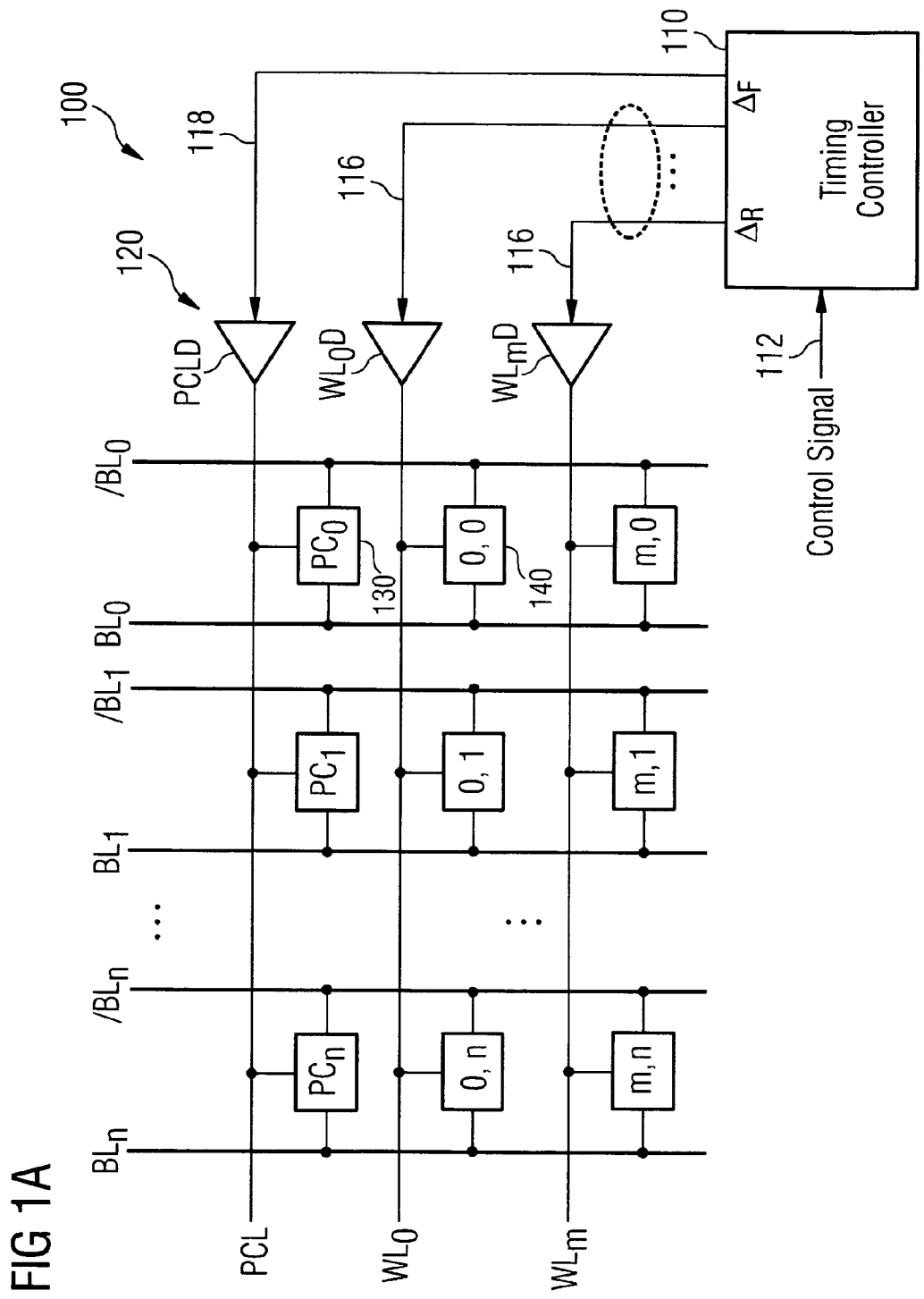

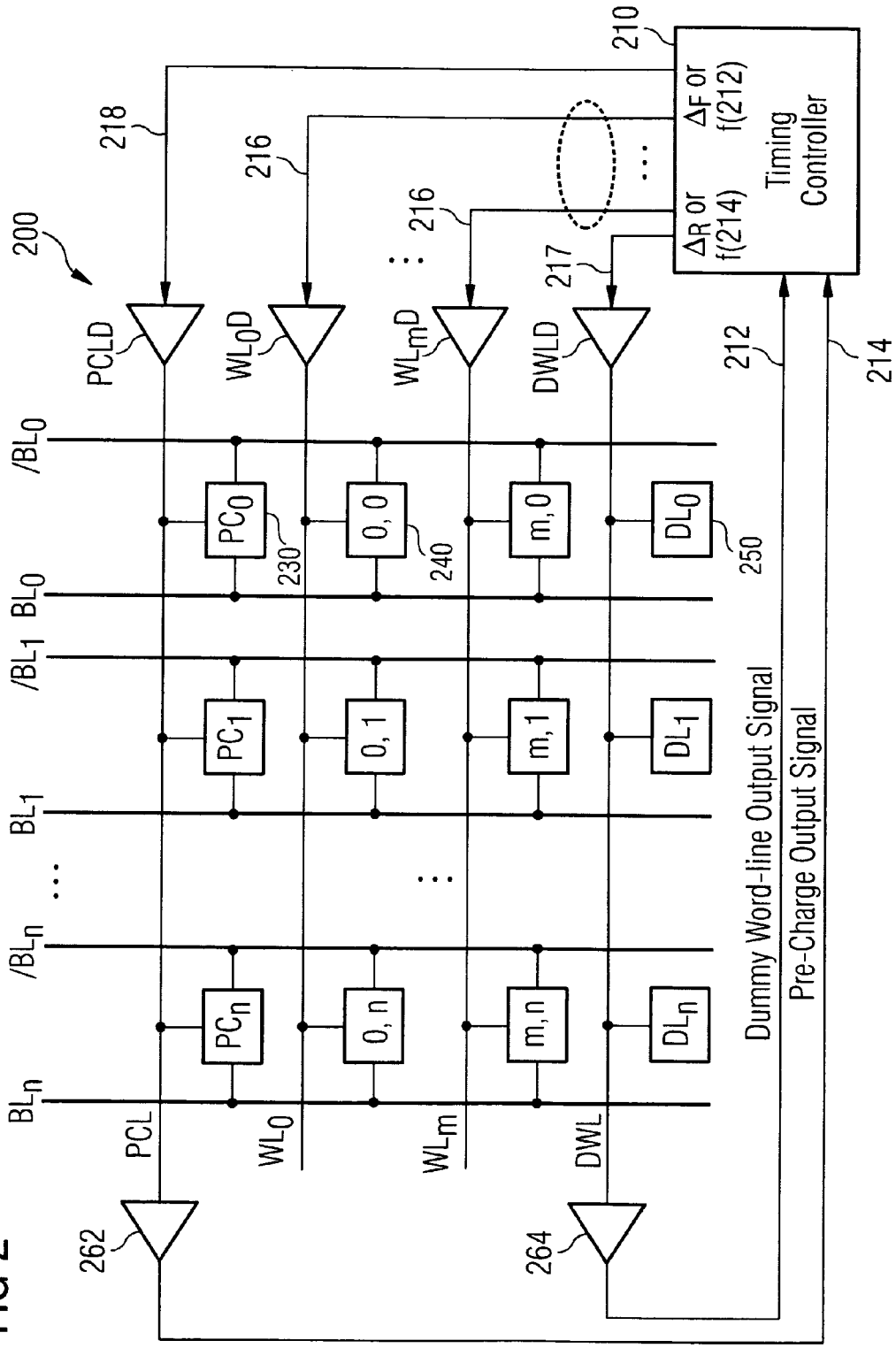

MEMORY DEVICE ARCHITECTURE AND METHOD FOR IMPROVED BITLINE PRE-CHARGE AND WORDLINE TIMING

TECHNICAL FIELD

The present invention relates to memory devices, and more particularly to a memory device architecture and a method for improved timing in bitline pre-charging and wordline operations.

BACKGROUND

FIG. 1A illustrates a memory device 100 in which conventional timing techniques for bitline pre-charging and wordline operations are employed. The device 100 includes a timing controller 110, pre-charge and wordline drivers PCLD and $WL_{0-m}D$ 120, respectively, pre-charge circuits $PC_{0-n}$ 130 coupled along a pre-charge line PCL, and memory cells 140 coupled as shown to n+1 pairs of bitlines BL and /BL and m+1 wordlines $WL_{0-m}$.

Timing controller 110 is operable to receive a control signal 112, e.g., a signal to activate a data read or write operation of a particular memory cell, and responsive thereto, generates a wordline triggering signal 116 for activating the wordline of the selected cell, and a pre-charge triggering signal 118. The wordline triggering signal 116 output from the timing controller 110 is operable to activate the wordline driver of the selected memory cell, the wordline driver operable to apply a desired wordline voltage on the selected cell's wordline. The pre-charge triggering signal 118 is operable to activate the pre-charge driver PCLD, which in turn operates to pre-charge (or discontinue pre-charging) the bitlines. The timing controller 110 controls the timing of the activation and deactivation of the pre-charge and wordlines, typically through the use of preset delays.

FIG. 1B illustrates a conventional process in which a memory cell read or write process is performed using the memory device 100 of FIG. 1A. Initially at 171, a previously activated bitline pre-charging process is stopped. At 172, a first predefined delay period is executed, and subsequent at 173, a selected wordline activated. Next at 174, a second predefined delay period is executed, after which at 175 read or write operations are performed. At 176 the selected wordline is deactivated, and at 177 a third predefined delay period is executed. At 178, the array bitlines are pre-charged in preparation for a subsequent read or write operation, and at 179, a fourth predetermined delay period is executed before deactivating bitline pre-charging circuits for the next read/write operation.

As can be understood from FIG. 1B, the total time needed for a read or write operation is heavily dependent upon the delay periods 172, 174, 176, and 179. In particular, it is important to minimize these delay periods in order to decrease the total time needed for a read or write operation.

While it is important to reduce the delay periods, it is also important that the periods be of sufficient duration so as not to interfere with the data reading or writing processes. In particular, each operation must be permitted to fully complete the subsequent operation in order for the read or write process to accurately conclude. Further, the delay period allocated for these processes must take into account possible operating condition extremes and process variations, which could further impact the timing of the illustrated processes.

In order to address this problem, a conventional approach presently used is the allocation of a first delay $\Delta_F$ for the generation of a bitline pre-charge triggering signal needed in processes 172 and 179, and a second delay $\Delta_R$ for the generation of a wordline triggering signal needed in processes 174 and 176. Unfortunately, the predetermined delay periods are not optimized for the particular memory device, and typically represent the worst possible process variations and operating conditions under which the memory device is fabricated and operated. Because the excess delay times are built into the memory devices, it is usually not possible to attain faster reading and writing speeds, even if the memory device is otherwise capable of doing so.

What is therefore needed is an improved memory device architecture and corresponding method for timing wordline and bitline charging operations, which enable shorter delay times.

SUMMARY OF THE INVENTION

The present invention provides a new memory device architecture and method for improved timing in bitline pre-charging and wordline operations, which enable shorter delay times and faster device speed. The memory device and method of operation can be designed such that the pre-charge and wordline timing operations trigger each other, thereby providing a much more optimum timing scheme than the conventional approach of providing a predetermined delay period for each of these operations. A further advantage of the invention is that pre-charge and wordline timing is inherently process dependent, such that memory devices fabricated under favorable process parameters can achieve faster read and write times.

In an exemplary embodiment, the memory device architecture having improved bitline pre-charge and wordline timing operations includes a pre-charge driver, a pre-charge line, a timing controller, a wordline driver, and a wordline coupled to a selected memory cell. The pre-charge driver is operable to supply a pre-charge signal to a pre-charge line when activated by the pre-charge triggering signal. The pre-charge line is operable to supply a pre-charge output signal. The timing controller is coupled to receive the pre-charge output signal, and based thereon, provide a wordline triggering signal. The wordline triggering signal is supplied to the wordline driver, which applies a wordline signal to the selected memory cell.

These and other features of the invention will be better understood when taken in view of the following drawings and detailed description.

BRIEF DESCRIPTION OF THE DRAWINGS

For a more complete understanding of the present invention, and the advantages thereof, reference is now made to the following descriptions taken in conjunction with the accompanying drawing, in which:

FIG. 1A illustrates a memory device in which conventional timing techniques for bitline pre-charging and wordline operations are employed;

FIG. 2 illustrates an exemplary memory device architecture having improved pre-charge and wordline timing in accordance with the present invention;

Figure 1B:
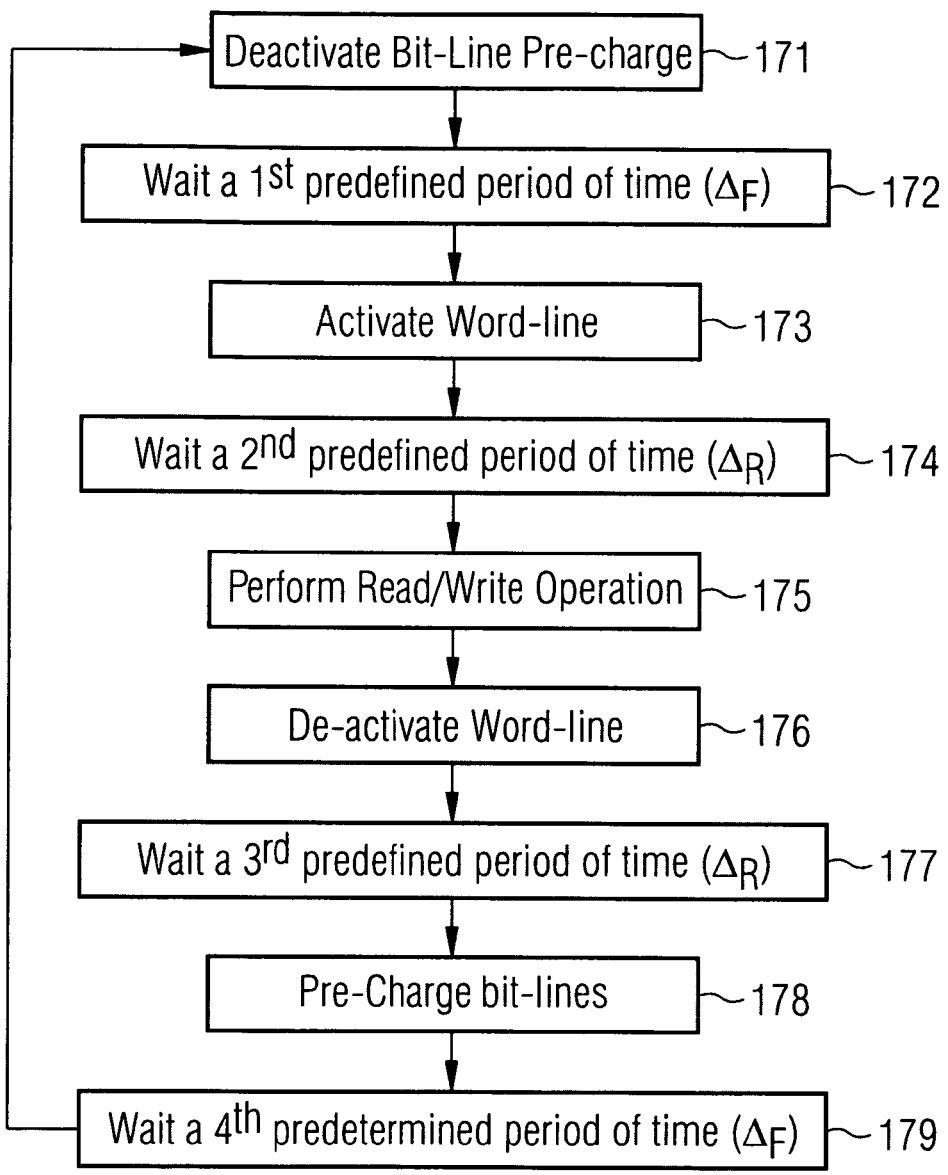
FIG. 1B illustrates a conventional process in which memory cell read or write processes are performed using the conventional memory device of FIG. 1A.

For clarity, previously defined features retain their reference numerals in subsequent drawings.

DETAILED DESCRIPTION OF ILLUSTRATIVE EMBODIMENTS

Memory Device Architecture

FIG. 2 illustrates an exemplary memory device architecture having improved pre-charge and wordline timing in accordance with the present invention. The memory device 200 includes a timing controller 210, wordline drivers 220, pre-charge circuits 230, memory cells 240, dummy cells 250, and pre-charge and wordline detectors 262 and 264. A particular implementation of the memory device is monolithic fabrication using a complementary metal oxide semiconductor (CMOS) process, although those skilled in the art will appreciate that other integrated circuit fabrication processes may be used as well. Further, the architecture and methods are not limited to an integrated device, and one or more of the components may be realized in discrete form.

As illustrated, the timing controller 210 provides a wordline triggering signal 216, a dummy wordline (DWL) triggering signal 217, and a pre-charge triggering signal 218. The wordline triggering signal 216 is supplied to its respective wordline driver $WL_{0-m}D$ which is coupled to the gate terminal of the selected memory cell. The DWL triggering signal 217 is coupled to a DWL driver, which is operable to output a DWL signal. Pre-charge triggering signal 218 is similarly supplied to a pre-charge driver PCLD. In the exemplary embodiment described herein, drivers 220 are operable to apply pre-charge, wordline and dummy wordline signals (typically voltages) upon their respective lines upon receiving corresponding input triggering signals. Alternatively, those knowledgeable in the art will appreciate that a delay may be inserted on one or more of the lines or into the drivers 220 to delay application of the line signal in other embodiments. Further, it is understood that the triggering signals 216, 217 and 218 may be of any state (e.g., high or low logic states) and that drivers 220 are operable to provide a signal corresponding thereto to the coupled lines.

The memory device further includes a row of n pre-charge circuits 230, which in a particular embodiment comprise the conventional bitline pre-charge circuit in which the pre-charge line is coupled to the gate terminals of three PMOS devices, the first transistor having its source and drain terminals coupled between adjacent bitlines BL and /BL, and the remaining two transistors have the source terminals coupled to VDD and their drains coupled to either the drain or source terminal of the third PMOS device. Memory cells 240 are coupled to one of the m wordlines $WL_{0-m}$ and to the pre-charge line (via one of the n-pairs of bitlines) in the conventional manner, the memory cells in an exemplary embodiment comprising a floating gate transistor in which the gate terminal is coupled to a corresponding wordline and the source and drain terminals coupled between adjacent bitlines BL and /BL. Dummy cells $DL_{0-n}$ 250 are coupled to the dummy wordline for simulating the loading conditions thereon, but not to the bitlines in the illustrated embodiment so as to minimize power consumption. As shown, the dummy wordline DWL is located most-distally from the pre-charge line PCL, thus the dummy wordline provides substantially the longest propagation delay for a pre-charge signal applied to bitlines BL and /BL relative to wordlines $WL_{0-m}$.

Detectors 262 and 264 are optionally employed at the distal ends of the pre-charge line PCL and the dummy wordline, each detector operable to detect the line signal present and to provide a corresponding output. Specifically, the pre-charge line detector 262 is operable to sense a pre-charge signal present on the pre-charge line PCL and to supply a pre-charge output signal 214 in response. Similarly, the DWL detector 264 is configured to detect a DWL signal on the DWL and to output a DWL output signal 212. The location of the detectors 262, 264 at the distal ends of the pre-charge and dummy wordlines enable detection of the corresponding pre-charge and DWL signals having substantially the longest propagation delay associated therewith. This embodiment of the invention is advantageous in that the longest propagation delay for each signal provides a time boundary after which device operations can be reliably made. The detectors may be of any design and construction operable to detect the desired signal parameter (e.g., voltage level), and in an exemplary embodiment comprises a Schmidt Trigger. Further, the detectors may be configured so as to provide an output signal when a line signal is sensed, when no line signal is sensed, or when a change in the line signal is detected. Those skilled in the art will appreciate that many different detection circuits may be used in alternative embodiments.

The memory device 200 is operable to generate pre-charge and wordline timing in three exemplary embodiments, each of which are described in greater detail below.

The three illustrated embodiments include using a signal having a predetermined delay $\Delta_F$ to provide the pre-charge triggering signal, and a pre-charge output signal 214 to provide the wordline trigger signals 216 and 217, or using a DWL output signal 212 used to provide a pre-charge triggering signal, and a predefined delayed signal $\Delta_R$ to provide the wordline triggering signals 216 and 217, or using the DWL output signal 212 to provide the pre-charge trigger signal 218, and the pre-charge output signal 214 to provide the wordline triggering signals 216 and 217. Each of these methods may be used in a multitude of memory device operations, such as reading from, and writing to the cells of the memory device. An exemplary embodiment of this process is further provided below.

Exemplary Method: Wordline Timing as a Function of a Pre-Charge Output Signal

Figure 3A:
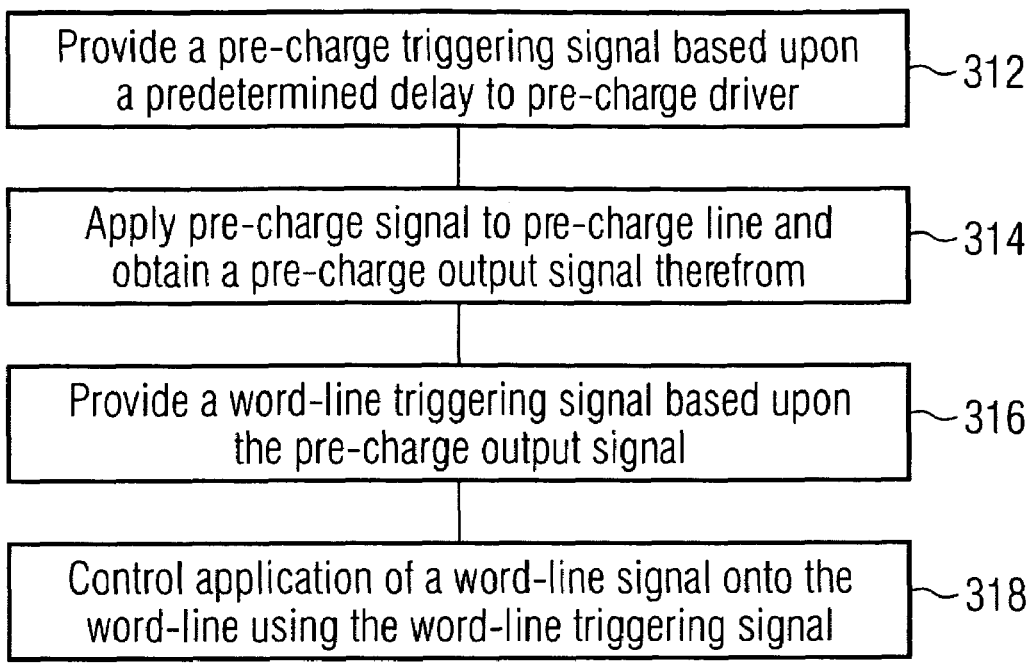
FIG. 3A illustrates a first exemplary method of the invention in which the timing of a wordline signal is triggered as a function of a pre-charge line signal.

FIG. 3A illustrates a first exemplary method of the invention in which the timing of a wordline signal applied to the wordline $WL_{0-M}$ is controlled as a function of the pre-charge output signal 214. Initially at 312, a pre-charge triggering signal 218 is provided based upon a predetermined delay, and the pre-charging triggering signal 218 provided to the pre-charging driver. At 314, the pre-charge driver outputs a pre-charge signal to the pre-charge line, and a pre-charge output signal 214 is generated therefrom. In a particular embodiment of this process, the pre-charge line detector 262 is operable to sense the voltage at the distal end of the PCL and provides the output signal 214.

At 316, the timing controller 210 receives the pre-charge output signal 214 and outputs, based thereon, a wordline triggering signal 216. In a particular embodiment of this process, the pre-charge output signal 214 is directly communicated with minimal additional signal processing (i.e., passed-though the timing controller 210 and multiplexed) as the wordline triggering signal 216. This embodiment ensures that no additional delay is introduced between the pre-charge and wordline and timing processes. In an alternative embodiment, additional signal processing, such as signal amplification, may be employed to further enhance stability and reliability of the device's operation.

At 318, a wordline signal is applied to the selected wordline using the wordline triggering signal 216. This operation is performed in the illustrated embodiment through the use of the driver circuit coupled to the selected wordline, the driver operable to apply a voltage onto the selected wordline upon receiving the wordline triggering signal 216.

Using this technique, timing of the wordline operations will follow the timing of the pre-charge operations, and the wordline operations will not be initiated until after the slowest of the pre-charge operations have been detected. If the condition of the memory device is such that the pre-charge operations represent the slowest link in the desired process, this technique may be used to govern the timing of the wordline operations to ensure proper timing thereof.

In an alternative embodiment of 312, the pre-charge triggering signal 218 is initially generated as a function of the DWL output signal 212, and further iterations of the pre-charge triggering signal subsequently derived from the predetermined delay. In such an embodiment, the operation of 316 may also include the process of providing a DWL triggering signal 217, the output of which leads to the generation of the DWL output signal used to provide the pre-charge triggering signal 218. Such a process may facilitate the fast acquisition of the required word and pre-charge line timing, while enabling reduced power consumption compared to the synchronous method illustrated in FIG. 3C.

Exemplary Method: Pre-Charge Timing as a Function of a DWL Output Signal

Figure 3B:
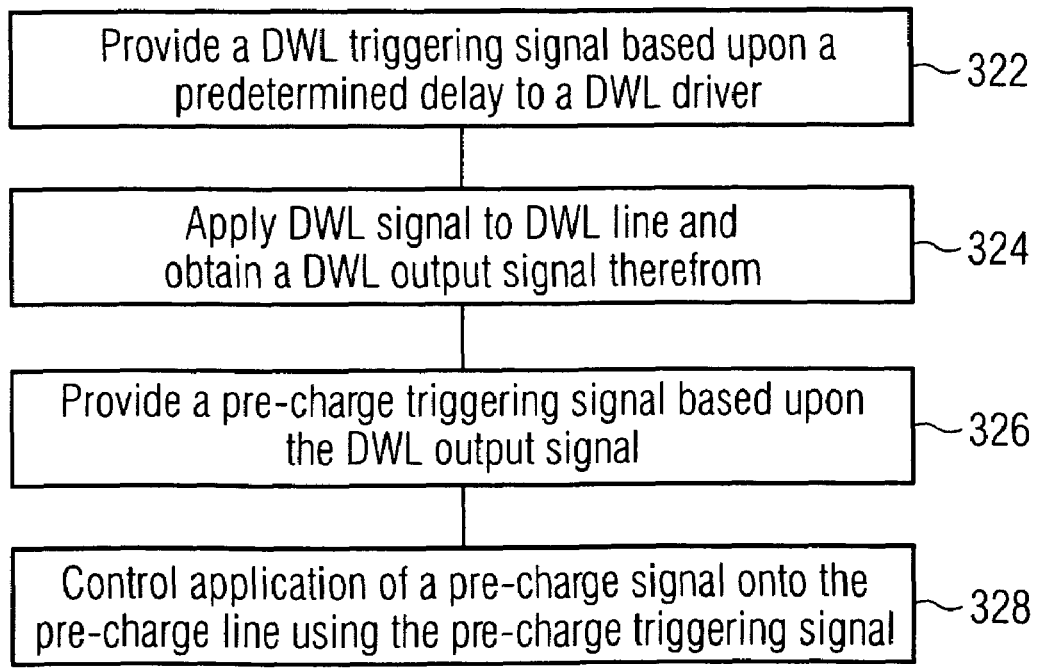
FIG. 3B illustrates a second exemplary method of the present invention in which pre-charge timing operations are triggered as a function of a dummy wordline signal.

FIG. 3B illustrates a second exemplary method of the present invention in which the pre-charge timing operations are triggered as a function of the dummy wordline output signal 212. Initially at 322, a DWL triggering signal 217 is provided based upon a predetermined delay, and the DWL triggering signal 217 provided to the DWL driver. At 324, the DWL driver outputs a DWL signal to the dummy wordline, and a DWL output signal 212 obtained therefrom. In a particular embodiment of this process, the DWL detector 264 is operable to sense the voltage at the distal end of the DWL and provides a DWL output signal 212.

Next at 326, the timing controller 210 receives the DWL output signal 212 and outputs, based thereon, a pre-charge triggering signal 218. In a particular embodiment of this process, the DWL output signal 212 is directly communicated (i.e., passed-though the timing controller 210) as pre-charge triggering signal 218. As with the first embodiment, the incorporation of no additional signal processing elements ensures that no additional delay is introduced between the wordline and pre-charge timing processes. In an alternative embodiment, additional signal processing, such as signal amplification, may be employed to further enhance stability and reliability of the device's operation.

In accordance with this technique, timing of the pre-charge line operations will follow the timing of the wordline operations, and the pre-charge operations will not be initiated until after the slowest of the wordline operations have been detected. If the condition of the memory device is such that the wordline operations represent the slowest link in the desired process, this technique may be used to govern the timing of the pre-charge operations to ensure proper timing thereof.

In an alternative embodiment of 322, the DWL triggering signal 217 is initially generated as a function of the pre-charge output signal 218, and further iterations of the pre-charge triggering signal subsequently derived from the predetermined delay. In such an embodiment, the operation of 326 may also include the process of providing a pre-charge triggering signal 218, the output of which leads to the generation of the pre-charge output signal used to provide the DWL triggering signal 217. Such a process may facilitate the fast acquisition of the required word and pre-charge line timing, while enabling reduced power consumption compared to the synchronous method illustrated in FIG. 3C.

Exemplary Method: Synchronous Wordline and Pre-Charge Timing

Figure 3C:
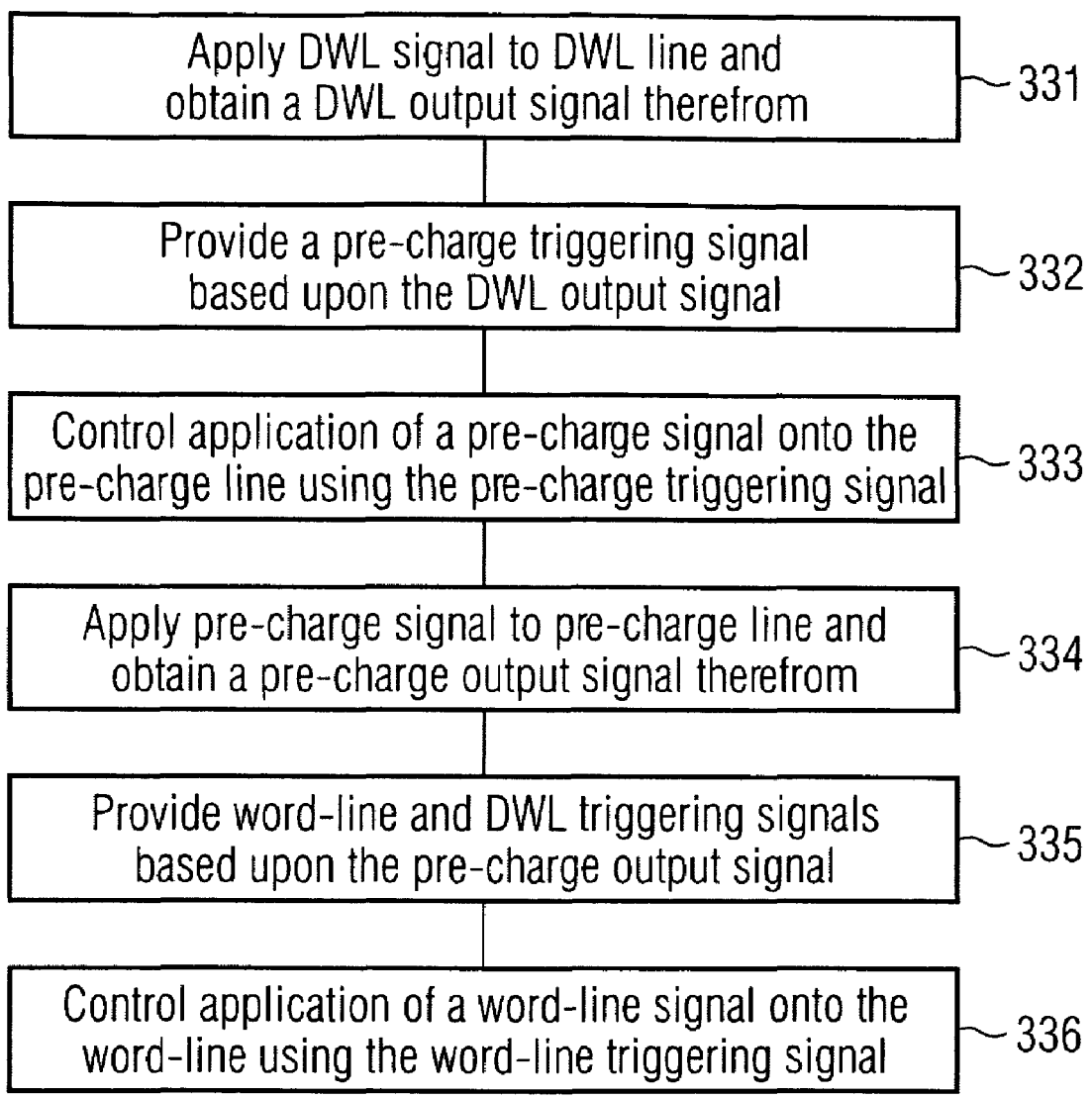
FIG. 3C illustrates a third exemplary embodiment of the invention in which word and pre-charge timing signals are synchronously obtained.

FIG. 3C illustrates a third exemplary embodiment of the invention in which both word and pre-charge timing are synchronously obtained. Initially at 331, a DWL signal is applied to the DWL, and the DWL output signal 212 obtained therefrom. As noted above, the process is achieved in one embodiment using the DWL detector 264.

At 332, the timing controller receives the DWL output signal 212, and based thereon, outputs a pre-charge triggering signal 218. In an exemplary embodiment the output pre-charge triggering signal 218 represents a passed-through version of the DWL output signal 212, although other signal processing may be inserted to further improve device performance. At 333, the application of the pre-charge signal onto the pre-charge line is controlled via the pre-charge triggering signal. The pre-charge driver PCLD 220 is operable to achieve this process in one embodiment, either immediately upon receiving the triggering signal 218, or alternatively with some predetermined delay.

At 334, a pre-charge output signal 214 is obtained from the pre-charge line PCL. The pre-charge detector 262 is operable to perform this process in the exemplary embodiment illustrated in FIG. 2 above. At 335, the timing controller receives the pre-charge output signal 214 and based thereon, outputs wordline and DWL triggering signals 216 and 217, the aforementioned possible alternative embodiments regarding additional signal conditioning applying equally as well. At 336, a wordline signal is applied via a corresponding wordline driver using the provided wordline triggering signal.

The method of FIG. 3C provides a synchronized or locked timing between pre-charge and wordline operations, whereby each operation is tied to the other. Accordingly, this methodology provides the greatest degree of timing reliability, in that the more limited (e.g., slowest) timing operation will automatically be adjusted to by the other. Thus, when the pre-charge and wordline operations are well matched, or when either may have an abrupt change in its timing, this process may be the most suitable.

Exemplary Memory Cell Read/Write Operation

As described above, the timing of wordline and bitline operations are critically important for the proper operations of high speed memory devices. Memory cell read and write operations rely upon the appropriate timing of wordline and bitline operations, and an exemplary embodiment of these operations is now presented.

Figure 4:
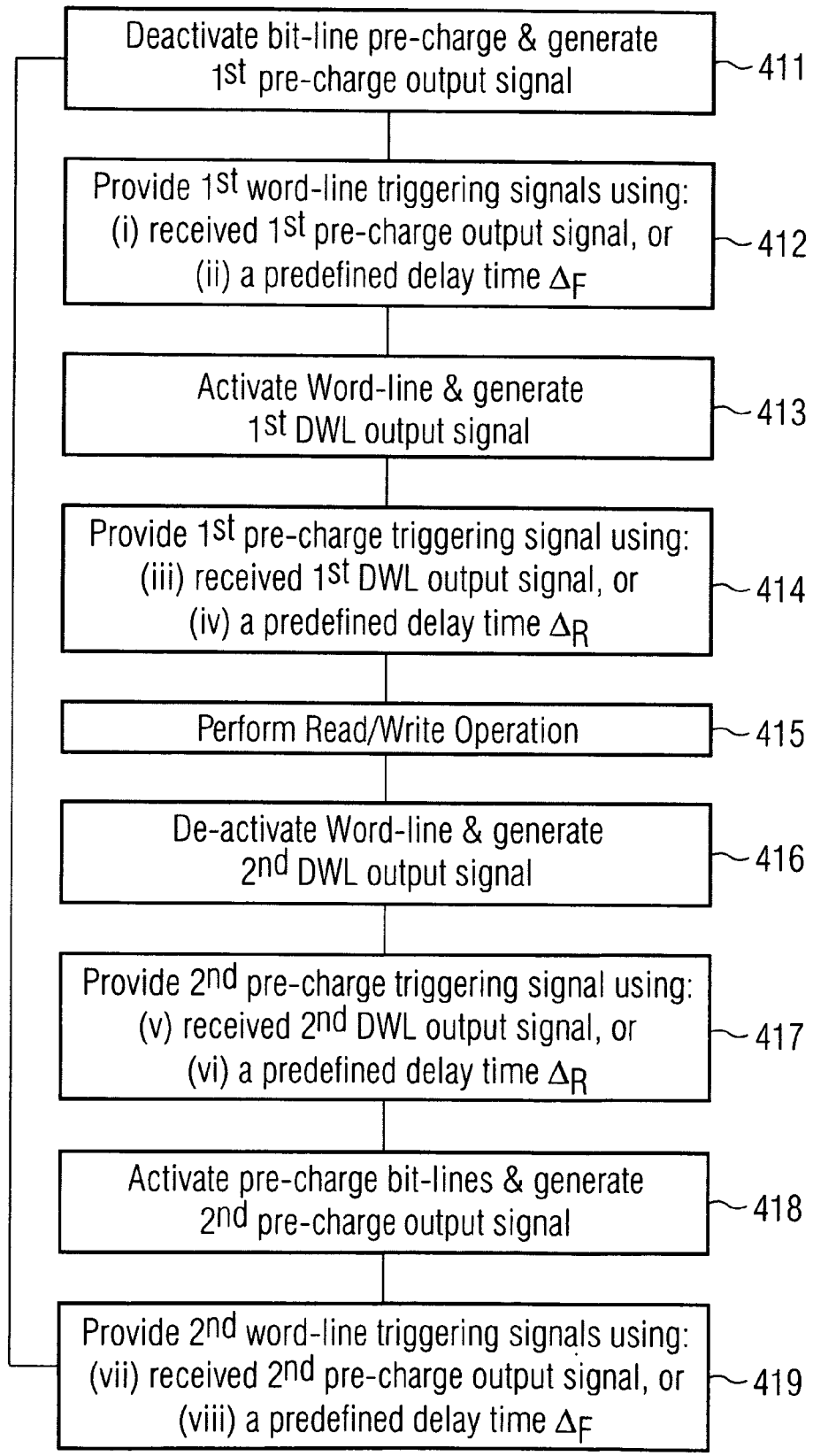
FIG. 4 illustrates an exemplary memory cell read/write operation using the pre-charge and wordline timing operations in accordance with one embodiment of the present invention.

FIG. 4 illustrates an exemplary memory cell read/write operation using the pre-charge and wordline timing operations in accordance with one embodiment of the present invention. Initially at 411, a bitline pre-charge operation is deactivated, the deactivation of the bitline generating a first pre-charge output signal. In a particular embodiment of the invention, this process is achieved by the supply of a pre-charge triggering signal 218 to the pre-charge driver PCL, subsequent deactivation of the pre-charge cells $PC_{0-n}$, sensing of the pre-charge line by the pre-charge detector 262, and the generation of a pre-charge output signal 214.

At 412, the timing controller 210 receives the $1^{st}$ pre-charge output signal and provides $1^{st}$ wordline triggering signals 216 and 217, the $1^{st}$ wordline triggering signals 216 and 217 based upon either the received $1^{st}$ pre-charge output signal 214, or a predefined delay, such as $\Delta_F$ described above. Exemplary embodiments of these processes are presented in the description above. The $1^{st}$ wordline triggering signals 216 and 217 are supplied to their respective wordlines, thereby activating the lines. The $1^{st}$ wordline triggering signal 216 is applied to its corresponding driver, the driver applying a wordline signal to the desired memory cell wordline. The $1^{st}$ DWL triggering signal 217 propagates along the DWL and is detected by the DWL detector 264, which in turns generates a $1^{st}$ DWL output signal 212 at 413.

At 414, the timing controller 210 receives the $1^{st}$ DWL output signal 212 and provides a $1^{st}$ pre-charge triggering signal 218, the $1^{st}$ pre-charge triggering signal 218 based upon either the received $1^{st}$ DWL output signal 212, or a predefined delay, such as $\Delta_R$ described above.

Exemplary embodiments of these processes are presented in the description above. Subsequently at 415, the selected memory cell is read from or written to, and the wordline coupled to the selected memory cell is deactivated. Deactivation of the selected wordline generates a $2^{nd}$ DWL output signal 212.

At 417, the timing controller 210 receives the $2^{nd}$ DWL output signal 212, and provides a $2^{nd}$ pre-charge triggering signal 218, the $2^{nd}$ pre-charge triggering signal 218 either the received $2^{nd}$ DWL output signal 212, or a predefined delay, such as $\Delta_R$.

At 418, the bitlines of the array are pre-charged, the charging producing a $2^{nd}$ pre-charge output signal 214.

At 419, the $2^{nd}$ pre-charge output signal 214 is supplied to the timing controller 210, which provides $2^{nd}$ wordline triggering signals 216 and 217, based upon either the received $2^{nd}$ pre-charge output signal 214, or a predefined delay, such as $\Delta_F$.

In a manner similar to the $1^{st}$ wordline triggering signals, the $2^{nd}$ wordline triggering signals are supplied to the selected wordline and DWL via corresponding drivers, and signals applied on the respective wordlines. Subsequently, bitline pre-charging is deactivated at 411, and the described process repeats as shown.

In a specific embodiment of the invention, at least one of the processes in (i), (iii), (v), or (vii) are executed, whereby at least one of the pre-charge triggering signals 218 is provided based upon a received DWL output signal 212, or at least one group of the wordline output signals 216 are provided based upon a received pre-charge output signal 214. In another specific embodiment, the processes of (i), (v), (vi) and (vii) are executed, whereby wordline triggering signals 216 are provided based upon (and may themselves comprise) the pre-charge output signal 214, and the pre-charge triggering signals 218 provided based upon a predetermined delay, such as $\Delta_R$. In a further specific embodiment, processes (ii) (iii), (v) and (viii) are executed, whereby the pre-charge triggering signal 218 is provided based upon (and may itself comprise) the DWL output signal 212, and the wordline triggering signals 216 provided based upon a predetermined delay, such as $\Delta_F$. In a third embodiment, each of the processes of (i), (iii), (v), are (vii) are executed, whereby each of the pre-charge triggering signals 218 is provided based upon a received DWL output signal 212, and each group of the wordline output signals 216 are provided based upon a received pre-charge output signal 214.

As readily appreciated by those skilled in the art, the described operations and processes may be implemented as executable instructions stored on a computer readable medium, the stored instruction code operable to program a computer, computer-controlled test equipment, or other such programmable device to carry out the intended functions. In a particular embodiment the executable instructions are included within a computer-readable storage unit or processor embedded within the memory device itself. The memory device may further include logic, or other firmware, which would facilitate performing the described operations and processes. In another embodiment of the invention, the executable instructions are resident on a computer-controlled test bed, either on a removable computer-readable medium, or stored in the volatile or non-volatile memory of the computer-controlled test bed in order to carry out the described processes and operations.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A memory device having a plurality of memory cells, the memory device comprising:
   a pre-charge driver having an input for receiving a pre-charge triggering signal and an output, the pre-charge driver operable to output a pre-charge signal when activated by the pre-charge triggering signal;
   a pre-charge line coupled to receive and supply the pre-charge signal to a plurality of bitlines, each of the bitlines coupled to a plurality of the memory cells, wherein the pre-charge line is further operable to supply a pre-charge output signal;
   a timing controller having an input coupled to receive the pre-charge output signal and an output, the timing controller operable to provide a wordline triggering signal based upon the received pre-charge output signal;
   a wordline driver having an input for receiving a wordline triggering signal and an output, the wordline driver operable to output a wordline signal when activated by the wordline triggering signal; and
   a wordline coupled to receive and supply the wordline signal to a plurality of the memory cells.

2. The memory device of claim 1, wherein the pre-charge output signal comprises substantially the longest pre-charge line propagation delay.

3. The memory device of claim 1, wherein the pre-charge triggering signal is provided by the timing controller, and wherein the pre-charge triggering signal comprises a signal having a predetermined delay $\Delta_R$.

4. The memory device of claim 1, further comprising a pre-charge detector coupled to a distal end of the pre-charge line, the pre-charge detector operable to detect the pre-charge signal developed at the distal end of the pre-charge line and to output, in response, the pre-charge output signal.

5. The memory device of claim 1, further comprising:
a dummy wordline driver having an input for receiving a dummy wordline triggering signal and an output, the dummy wordline driver operable to output a dummy wordline signal when activated by the dummy wordline triggering signal; and
a dummy wordline coupled to receive and supply the dummy wordline signal to a plurality of dummy cells coupled thereto, the dummy wordline operable to supply a dummy wordline output signal,
wherein, the timing controller further includes a second input coupled to receive the dummy wordline output signal from the dummy-wordline, and a second output coupled to the input of the pre-charge driver for applying the pre-charge triggering signal thereto, and
wherein the timing controller is operable to provide the pre-charge triggering signal based upon the received dummy wordline output signal.

6. The memory device of claim 5, wherein the dummy wordline is located substantially most-distally from the pre-charge line.

7. The memory device of claim 5, further comprising a dummy wordline detector having an input coupled to a distal end of the dummy wordline, the dummy wordline located substantially along a periphery of a memory array, the dummy wordline detector operable to detect the dummy wordline signal at the distal end of the dummy wordline and to generate, in response, the dummy wordline output signal.

8. A memory device having a plurality of memory cells, the memory device comprising:
a dummy wordline driver having an input for receiving a dummy wordline triggering signal and an output, the dummy wordline driver operable to output a dummy wordline signal upon receiving the dummy wordline triggering signal;
a dummy wordline coupled to receive and supply the dummy wordline signal to a plurality of dummy cells, the dummy wordline further operable to supply a dummy wordline output signal;
a timing controller having an input coupled to receive the dummy wordline output signal and an output, the timing controller operable to provide a pre-charge triggering signal based upon the received dummy wordline output signal;
a pre-charge driver having an input for receiving the pre-charge triggering signal and an output coupled to a plurality of bitlines, the pre-charge driver operable to output a pre-charge signal when activated by the pre-charge triggering signal; and
a pre-charge line coupled to receive and supply the pre-charge signal to the plurality of bitlines, each of the bitlines coupled to a plurality of the memory cells.

9. The memory device of claim 8, wherein the dummy wordline is located substantially most-distally from the pre-charge line.

10. The memory device of claim 8, further comprising a dummy wordline detector having an input coupled to the distal end of the dummy wordline and located substantially along a periphery of a memory array, the dummy wordline detector operable to detect the dummy wordline signal at the distal end of the dummy wordline and to provide the dummy wordline output signal.

11. The memory device of claim 8, wherein the dummy wordline triggering signal is generated by the timing controller, and wherein the dummy wordline triggering signal comprises a signal having a predetermined delay $\Delta_F$.

12. The memory device of claim 8, wherein the pre-charge line is further operable to supply a pre-charge output signal to the timing controller, and wherein the timing controller is operable to provide the dummy wordline triggering signal based upon the received pre-charge output signal.

13. The memory device of claim 12, wherein the pre-charge output signal comprises substantially the longest pre-charge line propagation delay.

14. The memory device of claim 12, further comprising a pre-charge detector coupled to a distal end of the pre-charge line, the pre-charge detector operable to detect the pre-charge signal developed at the distal end of the pre-charge line and to provide the pre-charge output signal.

15. In a memory device having a pre-charge line coupled to a plurality of bitlines, the plurality of bitlines and a wordline coupled to a plurality of memory cells, a method for controlling the timing of memory cell bitline pre-charge and wordline functions, the method comprising:
providing a pre-charge triggering signal based upon a predetermined delay to a pre-charge driver;
applying a pre-charge signal to the pre-charge line and obtaining a pre-charge output signal therefrom;
providing a wordline triggering signal based upon the pre-charge output signal; and
controlling the application of a wordline signal onto the wordline using the wordline triggering signal.

16. The method of claim 15, wherein the pre-charge output signal comprises substantially the longest pre-charge line propagation delay.

17. The method of claim 15, wherein the memory device further includes a pre-charge driver operable to supply the pre-charge signal to the pre-charge line upon receiving a pre-charge triggering signal, the method further comprising:
providing a pre-charge triggering signal having a predefined delay $\Delta_R$; and
applying the pre-charging triggering signal to the pre-charge driver to produce the pre-charge signal.

18. The method of claim 15, wherein the memory device further includes a pre-charge driver operable to supply the pre-charge signal to the pre-charge line upon receiving a pre-charge triggering signal, and a dummy wordline operable to supply a dummy wordline signal to a plurality dummy cells, the dummy wordline operable to supply a dummy wordline output signal, the method further comprising:
providing a pre-charge triggering signal based upon the received dummy wordline output signal; and
applying the pre-charging triggering signal to the pre-charge driver to produce the pre-charge signal.

19. The method of claim 18, wherein the dummy wordline is located substantially most-distally from the pre-charge line.

20. In a memory device having a pre-charge line coupled to a plurality of bitlines, the plurality of bitlines and a wordline coupled to a plurality of memory cells, the memory device further including a dummy wordline coupled to a plurality of dummy cells, a method for controlling the timing of memory cell bitline pre-charge and wordline functions, the method comprising:
providing a dummy wordline triggering signal based upon a predetermined delay to a dummy wordline driver;
applying a dummy wordline signal to the dummy wordline and obtaining a dummy wordline output signal therefrom;
providing a pre-charge triggering signal based upon the dummy wordline output signal; and
controlling the application of a pre-charge signal onto the pre-charge line using the pre-charge triggering signal.

21. The method of claim 20, wherein the dummy wordline is located substantially most-distally from the pre-charge line.

22. The method of claim 20, wherein the memory device further includes a dummy wordline driver operable to output the dummy wordline signal upon receiving a dummy wordline triggering signal, the method further comprising:
   providing a dummy wordline triggering signal having a predefined delay $\Delta_F$; and
   applying the dummy wordline triggering signal to the dummy wordline driver to produce the dummy wordline signal.

23. The method of claim 20, wherein the memory device further includes a dummy wordline driver operable to output the dummy wordline signal to the dummy wordline upon receiving a dummy wordline triggering signal, and a pre-charge driver operable to supply the pre-charge signal to the pre-charge line upon receiving a pre-charge triggering signal, the method further comprising:
   generating a dummy wordline triggering signal using the pre-charge output signal; and
   applying the dummy wordline triggering signal to the dummy wordline driver to produce the dummy wordline signal.

24. The method of claim 23, wherein the pre-charge output signal comprises substantially the longest propagation pre-charge line delay.

25. In a memory device having a pre-charge line coupled to a plurality of bitlines, the plurality of bitlines and a wordline coupled to a plurality of memory cells, the memory device further including a dummy wordline coupled to a plurality of dummy cells, a method for controlling the timing of memory cell bitline pre-charge and wordline functions, the method comprising:
   applying a dummy wordline signal to the dummy wordline and receiving a dummy wordline output signal therefrom;
   providing a pre-charge triggering signal based upon the received dummy wordline output signal;
   controlling the application of a pre-charge signal onto the pre-charge line using the pre-charge triggering signal;
   receiving a pre-charge output signal from the pre-charge line;
   providing a wordline triggering signal based upon the received pre-charge output signal; and
   controlling the application of a wordline signal onto the wordline using the wordline triggering signal.

26. The method of claim 25, wherein the pre-charge output signal comprises substantially the longest pre-charge line propagation delay, and the dummy wordline is substantially most-distally located from the pre-charge line.

27. A computer program product, resident on a computer readable medium, for providing executable instructions for controlling the timing of bitline pre-charge and wordline operations within a memory device, the memory device having a pre-charge line coupled to a plurality of bitlines, the plurality of bitlines and a wordline coupled to a plurality of memory cells within the memory device, the computer program product comprising:
   instruction code to provide a pre-charge triggering signal based upon a predetermined delay to a pre-charge driver;
   instruction code to apply a pre-charge signal to the pre-charge line and obtain a pre-charge output signal therefrom;
   instruction code to generate a wordline triggering signal based upon the pre-charge output signal; and
   instruction code to control the application of a wordline signal onto the wordline using the wordline triggering signal.

28. The computer program product claim 27, wherein the memory device further includes a pre-charge driver operable to supply the pre-charge signal to the pre-charge line upon receiving a pre-charge triggering signal, and a dummy wordline operable to supply a dummy wordline signal to a plurality dummy cells, the dummy wordline operable to supply a dummy wordline output signal, the computer program product further comprising:
   instruction code to provide a pre-charge triggering signal based upon the received dummy wordline output signal; and
   instruction code to apply the pre-charging triggering signal to the pre-charge driver to produce the pre-charge signal.

29. A computer program product, resident on a computer readable medium, for providing executable instructions for controlling the timing of bitline pre-charge and wordline operations within a memory device, the memory device having a pre-charge line coupled to a plurality of bitlines, the plurality of bitlines and a wordline coupled to a plurality of memory cells within the memory device, the computer program product comprising:
   instruction code to provide a dummy wordline triggering signal based upon a predetermined delay to a dummy wordline driver;
   instruction code to apply a dummy wordline signal to the dummy wordline and obtain a dummy wordline output signal therefrom;
   instruction code to provide a pre-charge triggering signal based upon the dummy wordline output signal; and
   instruction code to control the application of a pre-charge signal onto the pre-charge line using the pre-charge triggering signal.

30. The computer program product of claim 29, wherein the memory device further includes a dummy wordline driver operable to output the dummy wordline signal to the dummy wordline upon receiving a dummy wordline triggering signal, and a pre-charge driver operable to supply the pre-charge signal to the pre-charge line upon receiving a pre-charge triggering signal, the computer program product further comprising:
   instruction code to generate a dummy wordline triggering signal using the pre-charge output signal; and
   instruction code to apply the dummy wordline triggering signal to the dummy wordline driver to produce the dummy wordline signal.

31. A computer program product, resident on a computer readable medium, for providing executable instructions for controlling the timing of bitline pre-charge and wordline operations within a memory device, the memory device having a dummy wordline coupled to a plurality of dummy cells, a pre-charge line coupled to a plurality of bitlines, and a wordline, the plurality of bitlines and the wordline coupled to a plurality of memory cells within the memory device, the computer program product comprising:
   instruction code to apply a dummy wordline signal to the dummy wordline and receive a dummy wordline output signal therefrom;
   instruction code to provide a pre-charge triggering signal based upon the received dummy wordline output signal;

instruction code to control the application of a pre-charge signal onto the pre-charge line using the pre-charge triggering signal;
instruction code to receive a pre-charge output signal from the pre-charge line;
instruction code to provide a wordline triggering signal based upon the received pre-charge output signal; and
instruction code to control the application of a wordline signal onto the wordline using the wordline triggering signal.

* * * * *